United States Patent [19]

Takayama et al.

[11] Patent Number: 4,536,949

[45] Date of Patent: Aug. 27, 1985

[54] METHOD FOR FABRICATING AN INTEGRATED CIRCUIT WITH MULTI-LAYER WIRING HAVING OPENING FOR FUSE

[75] Inventors: Yoshihisa Takayama, Kawasaki; Kunihiko Gotoh, Kunitachi; Akihiko Ito, Kawasaki; Takeshi Yamamura, Zama; Kazuyoshi Fujita, Yokohama, all of Japan

[73] Assignee: Fujitsu Limited, Kawasaki, Japan

[21] Appl. No.: 609,441

[22] Filed: May 11, 1984

[30] Foreign Application Priority Data

May 16, 1983 [JP] Japan .................................. 58-85302

[51] Int. Cl.³ ......................................... H01L 21/28
[52] U.S. Cl. ...................................... 29/578; 29/589; 29/590; 29/591
[58] Field of Search ................... 29/589, 590, 591, 578

[56] References Cited

U.S. PATENT DOCUMENTS

| | | | |
|---|---|---|---|
| 3,564,354 | 2/1971 | Aoki et al. | 357/51 |
| 4,198,744 | 4/1980 | Nicolay | 29/578 X |
| 4,387,503 | 6/1983 | Aswell et al. | 29/576 B X |
| 4,420,504 | 12/1983 | Cooper et al. | 29/580 |
| 4,455,194 | 6/1984 | Yabu et al. | 29/578 X |
| 4,460,914 | 7/1984 | te Velde et al. | 357/51 |
| 4,481,263 | 11/1984 | Cooper et al. | 428/620 |
| 4,494,135 | 1/1985 | Moussie | 357/59 |

Primary Examiner—George T. Ozaki
Attorney, Agent, or Firm—Staas & Halsey

[57] ABSTRACT

A programmable integrated circuit has multi-layer wiring with openings over fuses, and a fabrication method forms the openings for each fuse, to avoid damage due to the blowing off of the fuses. The forming of the openings is performed by etching each insulating layer on the fuses after it is formed over the pre-formed wiring-layers. This results in shorter etching time as compared to the prior art etching method where the openings are etched in all the layers for the whole depth in one process step. Because of the shorter time necessary for each etching, overetching and side-etching are reduced, thus providing the openings with more accurately determined dimensions, which provides higher yield for manufacturing the device. The contact holes and the windows for the bonding pads in each insulating layer are etched in the same fabrication step for forming the openings for the fuses in the same insulating layer. This requires no additional fabrication processes for the IC and results in no increase of the fabrication time and cost.

12 Claims, 11 Drawing Figures

METHOD FOR FABRICATING AN INTEGRATED CIRCUIT WITH MULTI-LAYER WIRING HAVING OPENING FOR FUSE

BACKGROUND OF THE INVENTION

The present invention relates to integrated circuits (IC) with multi-layer wiring, which are programmable by burning off fuses provided in advance for disconnecting specific circuitries such as redundancy circuitries to meet the specific requirements for each IC. More particularly, it relates to a method for fabricating an opening for each fuse formed in the IC, to release generated heat and for dispersing materials and bursting gas when the fuse is blown off.

Recently, there has been an increasing use of fuses such as polycrystalline silicon (polysilicon) fuses for permanently programmable circuit elements. For example, these are used for selecting redundant circuit blocks in MOS memories. As another example, they are used to provide an accurate reference voltage source for a D/A converter, a coder/decoder (CODEC) and so on, where the reference voltages are adjusted by trimming circuits with fuses arranged in the circuits. In both cases, the fuses are selectively blown off by electrical or laser power according to a predetermined programming method.

Generally, polysilicon fuses are currently in use because of their relatively higher resistivity as compared to other materials and the availability of IC fabrication processes. The fuses are blown off by passing high current according to predetermined programming data.

The polysilicon fuses are arranged generally on the silicon substrate and are formed together with other polysilicon conducting paths for wiring the desired circuit. They are arranged on the same layer together with other electronic components such as transistors, diodes, resistors, capacitors and the like. They are sandwiched by a substrate and insulating layers such as a silicon dioxide ($SiO_2$) layer, a phospho-silicate glass (PSG) layer and so on, formed over the circuit layer to protect the circuit.

Usually a fuse is created by narrowing locally the width of the polysilicon conducting path at the portion where the fuse is to be positioned, so that the fuse will have higher resistivity than the remaining portion of the conducting path. By providing a specified electric current, the fuse (polysilicon resistor) is heated to a temperature high enough to be melted and blown off. Unfortunately, the generated heat at the fuse is conducted to the neighboring portions to heat them up to undesirable temperatures, which causes trouble. For example, the dopant concentration of an existing semiconductor junction might be changed. At the same time, the melted fuse material, and a vast volume of the gas released during the blowing off of the fuse, might burst out, thermally and mechanically destroying the layers in the vicinity of the fuse. This leads to disconnection or electrical shorting of the wiring and other damage. In addition, the blowing off is itself often not satisfactory and the circuitry of interest is not completely separated.

In order to eliminate these drawbacks, generally, an opening is arranged in a portion of any insulating layers over a fuse to expose the fuse to the surroundings, so as to dissipate the heat conducted from the blown off fuse and to release the dispersing melted material and gas. This is an effective countermeasure, but it is accompanied by another problem.

As the demand for higher integration increases, a multilayer wiring structure becomes applicable to these ICs. The multi-layer wiring system can provide the IC with not only a higher integration but also freedom of design for the IC. In the IC with a multi-layer wiring, a wiring layer must be covered by an insulating layer, and these are piled alternately until a necessary number of the wiring layers is completed. As a result, a fuse is covered by more than two insulating layers, and the openings must be formed by removing all the insulating layers over the fuse of interest. The removal of the insulating layers is performed by a conventional selective etching method, which is basically a chemical or physical process that is difficult to control for precise dimensions. This combines with a large thickness (more than several microns) of the insulator layers to be etched as described above, which causes difficulty in the process for fabricating the openings.

As an example, an IC device with two-layer wiring according to the prior art method will be described briefly. Enlarged, cross-sectional, elevation views are illustrated schematically in FIG. 1 and FIG. 2, showing the structure of the portion of a fuse before and after the etching operation for the opening respectively.

A silicon substrate 1 is covered by a silicon dioxide ($SiO_2$) layer 2 on which a wiring layer 3 including a polysilicon resistor fuse 4 is formed. These are covered by a silicon dioxide ($SiO_2$) layer 5 and a silicon nitride ($Si_3N_4$) layer 6, over which a phosphosilicate glass (PSG) layer 7 is formed. The second wiring layer 8 (formed of aluminum) is formed on the first PSG layer 7 and is connected to the wiring layer 3 through a contact hole 10 opened in the layers 5, 6 and 7 by an etching method. Finally, a PSG layer 9 is formed over the second wiring layer 8 as a passivation layer. Then, a window 14 for a bonding pad 8a is opened in the PSG layer 9 by etching with the aid of photolithographic technology, over which a photoresist film 11 is formed. A window 12 is opened in this film 11 above the fuse 4. As shown in FIG. 1, the device is then ready for fabricating an opening.

As is clearly seen from the figure, in order to form an opening 13 over the fuse 4 to expose it to the air, it is necessary to etch through the whole thickness of layers 9, 7, 6 and 5. In such a case, the etching operation is done by a combination of chemical (wet) and physical (dry) etching operations, but a long etching time is necessary for this purpose, which results in problems such as unavoidable overetching and underetching (the respective portions are denoted by dotted areas 13x and 13y respectively in FIG. 2). As a result, in the case of an IC with multi-layer wiring, it is very difficult to provide the opening with accurately determined dimensions, or to avoid overetching of undesirable portions of the wiring layer. These lead to decreasing the fabrication yield of the IC device, and are serious disadvantages of the prior art methods.

SUMMARY OF THE INVENTION

It is an object of the present invention to provide an IC with a multi-layer wiring having fuses with an improved fabrication method for providing a higher fabrication yield without a cost increase.

A further object of the present invention is to improve the fabrication process for providing the openings arranged over the corresponding fuses with higher dimensional accuracy.

The foregoing objects are attained by removing the portion of the insulating layer over the fuse of interest each time after an insulating layer is formed over the wiring layer. The removal is done by a conventional wet or dry etching method or by a combination thereof, but the etching depth is limited each time to the thickness of only the one insulating layer covering the fuse, so that each etching process is finished in a shorter time. This eliminates the trouble of unprecise dimensions of the etched openings and the overetching of the neighboring portion, resulting in increase of the fabrication yield of the ICs with multi-layer wiring. Accordingly, the etching operation for the openings can be performed together with the formation of contact holes or an opening for a bonding pad on the same insulating layer. Thus there is no necessity of an additional process for the removal of all the insulating layer portions on the fuse at one time for providing an opening. The cost does not increase as compared to the ordinary prior art process.

BRIEF DESCRIPTION OF THE DRAWINGS

All the figures illustrate partial, plan or cross-sectional, elevation views of an IC device with two-layer wiring, involving a contact and an opening for a fuse. They are enlarged and schematic figures, which are not drawn to scale and are strongly exaggerated in the direction of thickness.

FIGS. 3 to 10 schematically illustrate enlarged, plan or cross-sectional, elevation views of an IC device with two-layer wiring fabricated by the method according to the present invention, and show sequential fabricating steps.

FIG. 3 illustrates schematically an enlarged, cross-sectional, elevation view of an IC device with two-layer wiring, at the stage of completion of the first PSG layer over the $Si_3N_4$ layer.

FIG. 4 illustrates schematically an enlarged, cross-sectional, elevation view of an IC device with two layer wiring, at the step where the preliminary etching formation of an opening and a contact hole in the first PSG layer is finished.

FIG. 5 illustrates schematically an enlarged, cross-sectional, elevation view of an IC device with two-layer wiring at the step where the contact hole is completed.

FIG. 6 illustrates schematically an enlarged, cross-sectional, elevation view of an IC device with two-layer wiring, after patterning the second wiring layer.

FIG. 7 illustrates schematically an enlarged, cross-sectional, elevation view of an IC device with two-layer wiring, where the second PSG layer is formed over the second wiring layer.

FIG. 9 illustrates schematically an enlarged, cross-sectional, elevation view of an IC device with two-layer wiring, which is covered by a photoresist film layer having a window above the portion of the fuse and is ready for the final etching process to complete the opening.

FIG. 10 illustrates schematically an enlarged, cross-sectional, elevation view of an IC with a multi-layer wiring after the completion of the opening.

Throughout all the figures, the same reference numerals denote respective parts.

DESCRIPTION OF PREFERRED EMBODIMENTS

The present invention provides an improved method for fabricating openings for fuses formed in ICs with multi-layer wiring. The aforesaid drawback of the prior art fabricating method is avoided by dividing up the above-mentioned long etching process for forming the opening 13 for the fuse 4, since the etching process for the opening 13 is performed in part each time an insulating layer or passivation layer is formed on the wiring layer. In addition, in each etching process, a contact hole or an opening for a bonding pad is also formed to save fabrication time and cost.

Now the present invention will be disclosed in detail with reference to FIG. 3 to FIG. 10 for the case of an IC with two-layered wiring.

The elementary processing methods used, such as etching, insulating layer formation, aluminum sputtering, lithographic technology, etc., are conventional ones that are well known among those skilled in the art, so that the detailed description is omitted regarding these technologies in the following.

Figure 1:
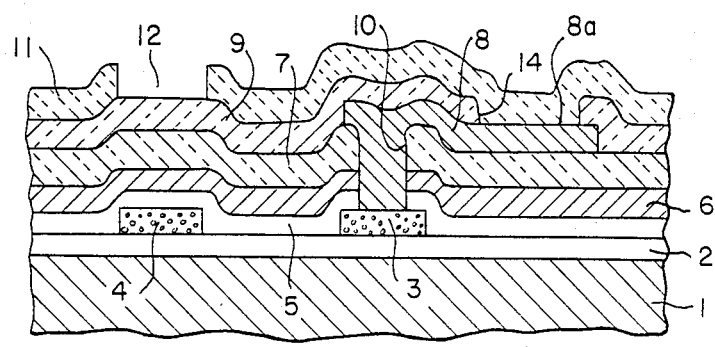
FIG. 1 illustrates schematically an enlarged, cross-sectional, elevation view of an IC device with two-layer wiring, ready for forming an opening for a fuse by an etching operation, according to a prior art fabrication method.
Figure 2:
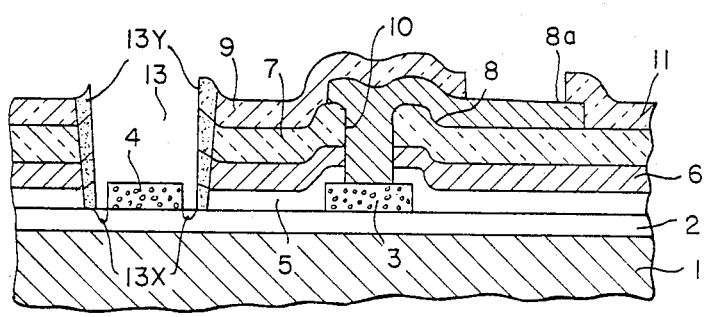
FIG. 2 illustrates schematically an enlarged, cross-sectional, elevation view of an IC device with two-layer wiring according to a prior art fabrication method, showing a state after the etching operation for forming an opening for a fuse.
Figure 3:
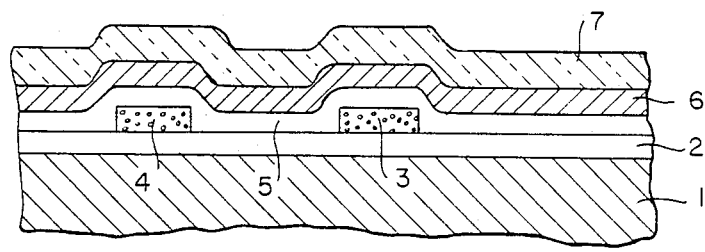

As shown in FIG. 3, a silicon dioxide ($SiO_2$) layer 2, a first wiring layer 3 including a fuse 4, a second silicon dioxide layer 5, a silicon nitride ($Si_3N_4$) layer 6 and a first PSG layer 7 are formed one above another on the silicon substrate 1 with processes similar to that for fabricating a conventional IC. However, the fabrication process according to the present invention proceeds as follows.

Figure 4:
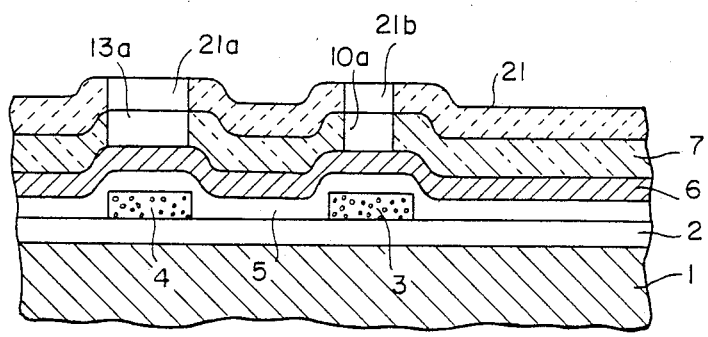

Step a: With a lithography technology, a photoresist film layer 21 is formed covering the PSG layer 7, with an opened hole or a window 21a on the portion of the opening 13a over the fuse 4, and with a hole 21b for the contact hole 10, as shown in FIG. 4. It is followed by a conventional isotropic wet etching process using a solution such as a mixture of hydrofluoric acid and other components. Of course, another dry etching method such as reactive ion plasma etching (RIPE), or chemical dry etching (CDE) or the like is applicable. These isotropic or anisotropic etching processes are selected depending on the required dimensional accuracy, the kind of the material to be etched, and ease of manufacture. The etching results in exposing the silicon nitride ($Si_3N_4$) layer 6 at the bottom of both etched holes 10a and 13a. After that, the photoresist film 21 is removed.

Figure 5:
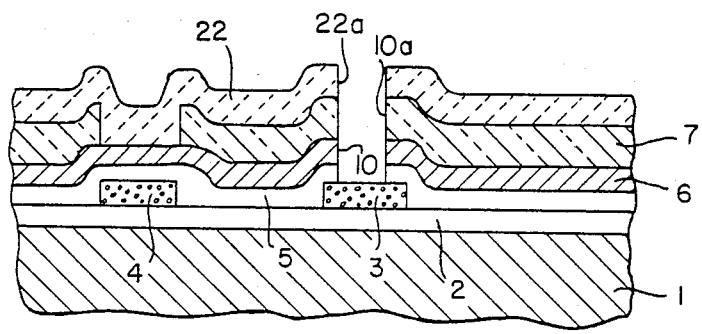

Step b: As shown in FIG. 5, the PSG layer 7 is covered again by a photoresist film layer 22 and a window 22a is opened by a lithographic method only on the portion for the contact hole 10, followed by an etching process to extend the contact hole 10a to reach the first wiring layer 3 to complete a contact hole 10. The fuse 4 is still protected by the layers 5 and 6.

Figure 6:
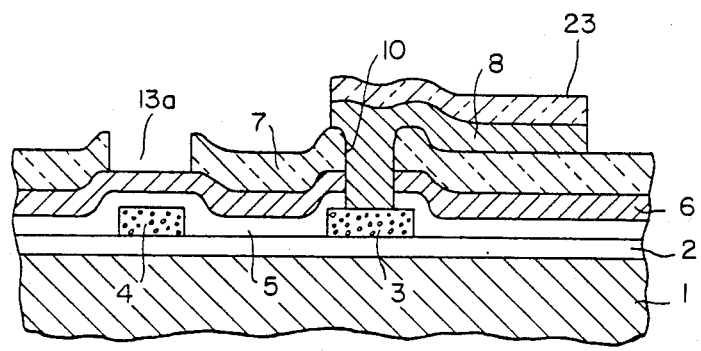

Step c: After removing the residual photoresist film 22, an aluminum sputtering process occurs over the PSG layer 7. The sputtered aluminum fills up the contact hole 10 with aluminum, connecting the wiring layer 3 and the sputtered aluminum layer of which the second wiring layer 8 is to be patterned. The sputtered aluminum layer is etched selectively by the aid of a patterned photoresist film layer 23 to form the second wiring layer 8 as shown in FIG. 6.

Figure 7:
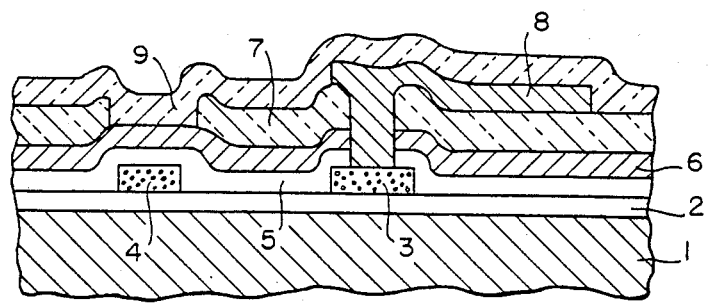

Step d: Following the completion of the second wiring pattern, the second PSG layer 9 is formed over the second wiring layer 8, by a chemical vapor deposition (CVD) method to avoid damaging the aluminum layer due to any temperature rise. This state is shown in FIG. 7.

Figure 8A:
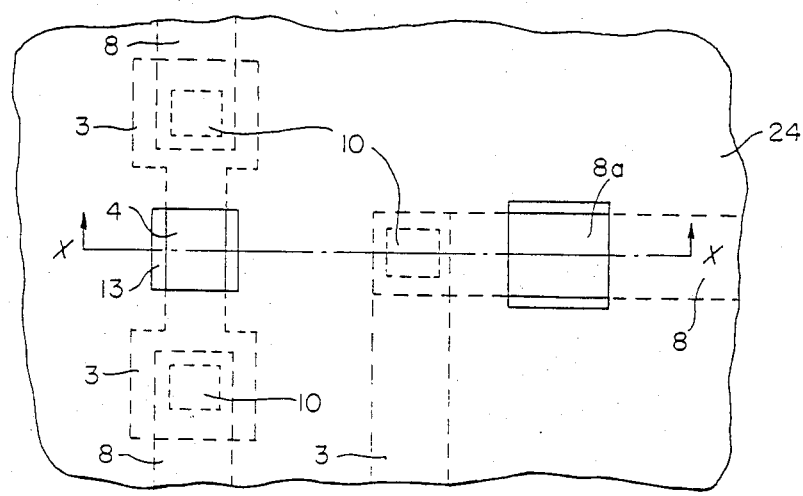
FIG. 8(a) illustrates schematically an enlarged, plan view of an IC device with two-layer wiring, where the second PSG layer is etched to provide a window for a bonding pad and a partially formed opening in the layers over the fuse.

Step e: A photoresist film layer 24 having a window 24a on the portion of the fuse 4 and a window 24b for a bonding pad 8a is formed over the second PSG layer 9, whose exposed portion is removed by etching to form a partial opening 13b over the fuse and a hole (window) 8b for a bonding pad 8a exposing the aluminum layer surface. This is illustrated in FIG. 8(a) in a plan view and FIG. 8(b) in a cross-sectional view.

Figure 9:
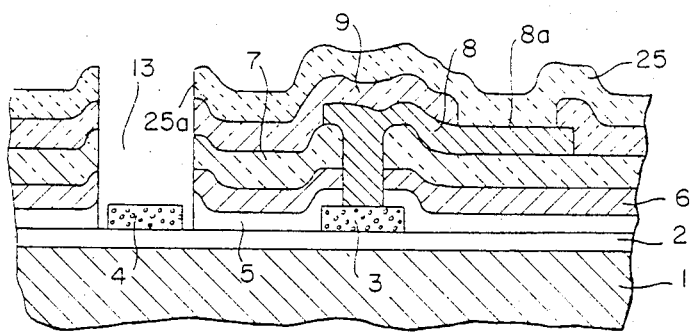

Step f: Following the above-mentioned process, the surface of the PSG layer 9 is covered with a photoresist film layer 25 except the portion of the partial opening 13a. The aluminum layer of the bonding pad 8a is protected by the photoresist film 25 against the etching to follow, by which the portions of the silicon nitride ($Si_3N_4$) layer 6 and silicon dioxide ($SiO_2$) layer 5 are etched and removed to complete the opening 13 to expose the fuse 4 as shown in FIG. 9.

Figure 10:
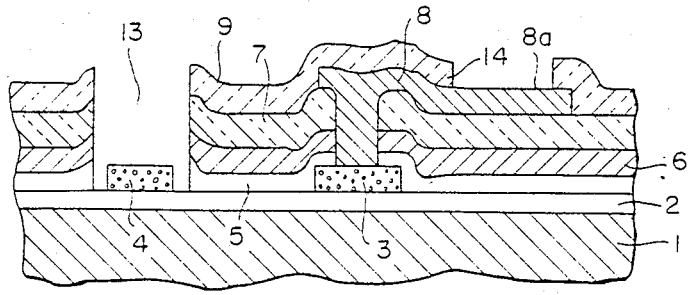

Removing the photoresist film layer 25, the fabrication process for the opening for the fuse is finished, as shown in FIG. 10.

Figure 8B:
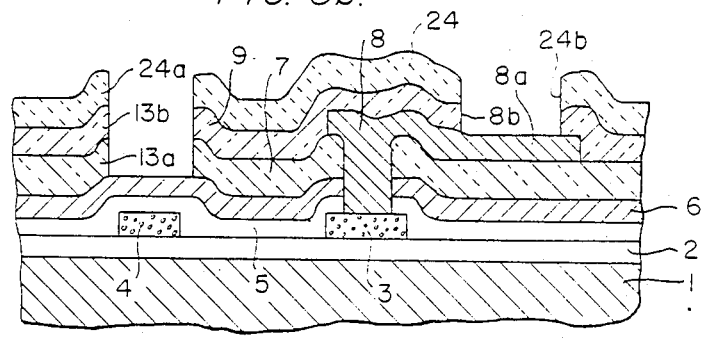
FIG. 8(b) illustrates schematically an enlarged, cross-sectional, elevation view of an IC device with two-layer wiring along the dot-dash line X—X in FIG. 8(a), where the second PSG layer is etched to provide a window for the bonding pad and the partially formed opening in the layers over the fuse.

Considering the phenomena induced by the blowing off of a fuse, it could be easily understood that the complete exposure to the surroundings of the fuse is not always necessary, and that some thin layers may be allowed to remain on the fuse to protect the fuse against a surrounding hazard. For example, thin layers such as the nitride layer 6 and the silicon oxide layer 5 might be allowed to remain on the surface of the fuse 4 as shown in FIG. 8(b), thus avoiding the fabrication process of step f, to reduce the cost.

The description above of the present invention is for the case of an IC with two-layer wiring, but it is clear to those skilled in the art that the present invention is applicable to an IC device having more than a two-layer wiring, by repeating certain of the processes discussed above, such as steps a, b, c, and d.

We claim:

1. A method for fabricating an integrated circuit device with multi-layer wiring and having an opening for a fuse in said multi-layer wiring, comprising the steps of:
    (a) forming a first wiring layer of said multi-layer wiring to include said fuse;
    (b) forming a first insulating layer covering said first wiring layer and said fuse;
    (c) forming a contact hole in said first insulating layer for connection to said first wiring layer and removing at least a part of the whole thickness of said first insulating layer at a portion thereof over said fuse for providing said opening;
    (d) forming a second wiring layer over said first insulating layer and connecting said second wiring layer to said first wiring layer through said contact hole;
    (e) forming a second insulating layer covering said second wiring layer; and
    (f) removing a respective portion of said second insulating layer over said fuse for providing said opening.

2. The method of claim 1, wherein said step (d) comprises forming a bonding pad of said second wiring layer, and said step (f) comprises forming a window in said second insulating layer for exposing said bonding pad.

3. The method of claim 1, comprising at least one cycle of the further steps:
    forming a further wiring layer on the topmost insulating layer;
    forming a further insulating layer covering said further wiring layer and said opening over said fuse; and
    removing a respective portion of said further insulating layer for providing said opening over said fuse and a further respective portion of said further insulating layer for providing a hole for contacting a respective underlying wiring layer.

4. The method of claim 1, comprising at least one cycle of the following steps before said step (a):
    forming a wiring layer; and
    forming an insulating layer on said wiring layer.

5. The method of claim 1, 2, 3 or 4, wherein at least one of said first and second insulating layers comprises a plurality of sub-layers of different insulating materials.

6. The method of claim 5, wherein:
    said step (b) comprises forming said first insulating layer to comprise said plurality of sublayers; and
    said removing of said step (c) comprises removing at least the topmost one of said sublayers at said portion of said first insulating layer over said fuse;
    said method comprising the further step, after said step (f), of removing the remaining sublayers at said portion of said first insulating layer over said fuse for providing said opening.

7. The method of claim 5, wherein at least one of said sub-layers is allowed to remain on said fuse in said opening.

8. The method of claim 5, wherein said sub-layers are selected from silicon dioxide and silicon nitride.

9. The method of claim 1, wherein said first and second insulating layers comprise phosphosilicate glass.

10. The method of claim 1, wherein the material of said first wiring layer is polycrystalline silicon.

11. The method of claim 1, 2, 3, 4, 9 or 10, wherein said opening extends across the entire width of said first wiring layer at a respective portion of said fuse.

12. The method of claim 5, wherein said opening extends across the entire width of said first wiring layer at a respective portion of said fuse.

* * * * *